(12) United States Patent
Itano et al.

(10) Patent No.: US 9,399,734 B2
(45) Date of Patent: Jul. 26, 2016

(54) ETCHING SOLUTION

(75) Inventors: Mitsushi Itano, Settsu (JP); Shingo Nakamura, Settsu (JP); Takehiko Kezuka, Settsu (JP); Daisuke Watanabe, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 261 days.

(21) Appl. No.: 12/595,424

(22) PCT Filed: Apr. 8, 2008

(86) PCT No.: PCT/JP2008/056958
§ 371 (c)(1),
(2), (4) Date: Oct. 9, 2009

(87) PCT Pub. No.: WO2008/129944
PCT Pub. Date: Oct. 30, 2008

(65) Prior Publication Data
US 2010/0112821 A1 May 6, 2010

(30) Foreign Application Priority Data

Apr. 13, 2007 (JP) ................................. 2007-105601

(51) Int. Cl.
| C09K 13/08 | (2006.01) |
| H01L 21/02 | (2006.01) |
| H01L 21/306 | (2006.01) |
| H01L 21/3105 | (2006.01) |
| H01L 21/311 | (2006.01) |
| H01L 21/3213 | (2006.01) |
| H01L 21/768 | (2006.01) |
| C09K 15/00 | (2006.01) |
| C09K 13/00 | (2006.01) |
| C09K 13/06 | (2006.01) |

(52) U.S. Cl.
CPC .................. *C09K 13/08* (2013.01); *C09K 13/00* (2013.01); *C09K 13/06* (2013.01); *C09K 15/00* (2013.01); *H01L 21/02052* (2013.01); *H01L 21/02063* (2013.01); *H01L 21/30604* (2013.01); *H01L 21/31053* (2013.01); *H01L 21/31105* (2013.01); *H01L 21/31111* (2013.01); *H01L 21/31133* (2013.01); *H01L 21/32134* (2013.01); *H01L 21/76814* (2013.01)

(58) Field of Classification Search
CPC ........ C09K 13/08; C09K 13/00; C09K 13/06; C03C 15/00; H01L 21/31111; H01L 21/02052; H01L 21/31133; H01L 21/76814; H01L 21/31053; H01L 21/32134; H01L 21/30604; H01L 21/31105
See application file for complete search history.

(56) References Cited

U.S. PATENT DOCUMENTS

| 4,921,572 | A | * | 5/1990 | Roche .............................. 216/99 |
| 6,200,891 | B1 | * | 3/2001 | Jagannathan et al. ......... 438/622 |
| 7,169,323 | B2 | | 1/2007 | Parent et al. |
| 2004/0224866 | A1 | | 11/2004 | Matsunaga et al. |
| 2006/0091355 | A1 | * | 5/2006 | Itano et al. .................... 252/79.1 |
| 2006/0178282 | A1 | * | 8/2006 | Suyama et al. ............... 510/175 |

FOREIGN PATENT DOCUMENTS

| JP | 09-022891 A | 1/1997 |
| JP | 09-115875 A | 5/1997 |
| JP | 2000-160367 A | 6/2000 |
| JP | 2003-068699 A | 3/2003 |
| JP | 2005-150236 A | 6/2005 |

OTHER PUBLICATIONS

Dow Chemical data on specialty amines, http://www.dow.com/amines/prod/tpp_ethyl.htm.*
DuPont, "Methylamine Technical Information", http://www2.dupont.com/Methylamines/en_US/tech_info/index.html, 2013.*

* cited by examiner

*Primary Examiner* — Jiong-Ping Lu
(74) *Attorney, Agent, or Firm* — Sughrue Mion, PLLC

(57) ABSTRACT

An etching solution, a process of producing the same, and an etching process using the same, in which the etching solution includes hydrofluoric acid (a), ammonium fluoride (b), and salt (c) formed between hydrogen fluoride and a base having a boiling point higher than that of ammonia; the concentration of ammonium fluoride (b) is not higher than 8.2 mol/kg, and the total amount of ammonium fluoride (b) and salt (c) formed between hydrogen fluoride and a base having a boiling point higher than that of ammonia is not less than 9.5 mol/kg.

6 Claims, No Drawings

ETCHING SOLUTION

TECHNICAL FIELD

The present invention relates to an etching solution for a silicon oxide film used in processes such as a semiconductor process and a liquid crystal process; a process of producing the same; an etching process using the etching solution; and a method of producing an etched article using the etching solution.

BACKGROUND ART

Buffered hydrofluoric acid, i.e., a mixture of hydrofluoric acid and ammonium fluoride solution, has been used for a wet etching solution for silicon oxide films (for example, Patent Documents 1 and 2). In a semiconductor manufacturing process, etching is performed by immersing a wafer in a chemical bath containing buffered hydrofluoric acid. However, there is a known drawback: because a chemical bath usually has an opening for immersing a wafer, the chemical composition changes over time due to the evaporation of chemical components, which significantly affects the etch rate. Accordingly, the entire amount of the chemical solution needs to be replaced over time, which poses problems in terms of process efficiency and the effective use of resources.

Paragraph 0005 in Patent Document 1 states that "when the buffered hydrofluoric acid (BHF) whose chemical composition is 0.1% HF and 40% $NH_4F$ is used, the etch rate of a thermally-oxidized film is 1.6 nm/min at 25° C. However, when such a chemical solution is left to stand for 3 days in an environment with a humidity of 40% and an ambient temperature of 25° C., the etch rate becomes 4.2 nm/min, which is approximately 2.6 times faster. Such an environment-dependent chemical solution cannot be used in a semiconductor process in the future".

The dissociation of ammonium fluoride, ammonium ion, and hydrofluoric acid in buffered hydrofluoric acid is expressed by the following Formulae (1) to (4).

$$NH_4F \rightarrow NH_4^+ + F^- \quad (1)$$

$$NH_4^+ \leftrightarrows NH_3 + H^+ (pKa=9.24) \quad (2)$$

$$HF \leftrightarrows H^+ + F^- (pKa=3.17) \quad (3)$$

$$HF + F^- \leftrightarrows HF_2^- \quad (4)$$

When the buffered hydrofluoric acid having a chemical composition as described in Patent Document 1 (HF=0.1 mass %, $NH_4F$=40 mass %) is left to stand, for example, in an environment with a humidity of 40% and a temperature of 25° C., ammonia evaporates according to Formula (2), and protons ($H^+$) are released into the solution. Because hydrofluoric acid is a weak acid having a pKa of 3.17, the released $H^+$ reacts with fluoride ion ($F^-$) produced according to Formula (1), generating hydrogen fluoride (HF) according to Formula (3). HF further reacts with $F^-$, generating $HF_2^-$ that acts as an etching species for a silicon oxide film. Consequently, when buffered hydrofluoric acid having a chemical composition as described above is left to stand, the chemical composition changes and the etch rate of the silicon oxide film increases, and the chemical solution becomes unusable.

In addition, it is stated in paragraph 0019 of Patent Document 1 that "when the $NH_4F$ concentration is greater than 30 mass %, although the amount of evaporation of the chemical solution is small, the composition of the chemical solution changes. Consequently, it is difficult to restore the chemical solution to the original composition".

Further, Patent Document 1 discloses a technology relating to buffered hydrofluoric acid, specifically, to one having an HF concentration of not more than 0.1 mass % and the $NH_4F$ concentration of not more than 30 mass %. In this technology, a time-dependent change in the chemical composition is reduced by supplying a composition-adjusting chemical solution to a chemical bath, thereby maintaining the predetermined chemical composition of a chemical solution in the chemical bath whose composition has changed. However, Patent Document 1 merely describes a reduction of the change in the chemical composition by controlling the environment in which the chemical solution is used. The described technology does not reduce change in the composition by improving the chemical solution itself.

Patent Document 1: Japanese Unexamined Patent Publication No. 9-22891

Patent Document 2: Japanese Unexamined Patent Publication No. 9-115875

DISCLOSURE OF THE INVENTION

Technical Problem

An object of the present invention is to provide an etching solution in which a change in the composition due to the evaporation of the chemical solution or the like is small, thus reducing the frequency with which the chemical solution must be replaced, and in which the time-dependent change in the etch rate is also small, thus making uniform etching of a silicon oxide film possible.

Solution to Problem

The inventors of the present invention have intensively studied to achieve the above described object, and as a result, obtained the following findings.

The inventors found that the etch rate in buffered hydrofluoric acid increases when the ammonium fluoride concentration exceeds 30 mass % (8.2 mol/kg) because such a concentration causes the evaporation of ammonia and an increase in $HF_2^-$ that acts as an etching species for silicon oxide film. Accordingly, the evaporation of ammonia may be reduced by using a fluoride salt formed between hydrogen fluoride and a base having a boiling point higher than that of ammonia (−33° C. at 1 atm), instead of a fluoride salt formed between hydrogen fluoride and ammonia.

In addition, as shown in Patent Document 2, a buffered hydrofluoric acid used for contact hole cleaning and the like has an ammonium fluoride concentration particularly ranging from 35 mass % (9.5 mol/kg) to 40 mass % (10.8 mol/kg). Use of such buffered hydrofluoric acid helps to maintain the processing dimensional accuracy. Buffered hydrofluoric acid with a higher ammonium fluoride concentration can achieve a higher processing dimensional accuracy because the etch rate of various oxide films becomes more uniform as the ammonium fluoride concentration increases. Accordingly, in order to maintain a certain level of processing dimensional accuracy, the fluoride salt concentration needs to be comparable to the ammonium fluoride concentration of 35 mass % (9.5 mol/kg). Accordingly, the total concentration of ammonium fluoride and a salt formed between hydrogen fluoride and a base having a boiling point higher than that of ammonia should not be less than 9.5 mol/kg.

Consequently, insofar as the buffered hydrofluoric acid contains ammonium fluoride at a concentration of higher than 8.2 mol/kg (30 mass %) and a salt formed between hydrogen fluoride and a base having a boiling point higher than that of ammonia such that the total amount of these components is not less than 9.5 mol/kg, a change in the composition due to the evaporation of the chemical solution or the like is small even if the solution is left to stand; thus the etch rate of a silicon oxide film does not increase. This results in a long-lasting etching solution that is replaced at a reduced frequency. In addition, because the fluoride salt concentration is not less than the ammonium fluoride concentration (i.e., not less than 9.5 mol/kg (35 mass %)) of buffered hydrofluoric acid used for contact hole cleaning and the like, the processing dimensional accuracy can also be satisfied. The present invention was completed as a result of further studies based on the above knowledge.

Specifically, the present invention provides the following etching solution.

Item 1. An etching solution comprising hydrofluoric acid (a), ammonium fluoride (b), and a salt (c) formed between hydrogen fluoride and a base having a boiling point higher than that of ammonia, the concentration of ammonium fluoride (b) being not higher than 8.2 mol/kg, and the total amount of ammonium fluoride (b) and salt (c) formed between hydrogen fluoride and a base having a boiling point higher than that of ammonia being not less than 9.5 mol/kg.

Item 2. The etching solution according to item 1, wherein the base has a boiling point of not less than −30° C.

Item 3. The etching solution according to item 1 or 2, wherein the concentration of hydrogen fluoride (HF) in the etching solution is not more than 0.5 mol/kg (1 mass %).

Item 4. The etching solution according to any one of items 1 to 3, wherein the base having a boiling point higher than that of ammonia is at least one member selected from the group consisting of a primary amine, a secondary amine, a tertiary amine, and a quaternary ammonium.

Item 5. The etching solution according to item 4, wherein the primary amine is at least one member selected from the group consisting of methylamine, ethylamine, propylamine, butylamine, pentylamine, hydroxylamine, ethanolamine, propanolamine, butanolamine, methoxyethylamine, and methoxypropylamine.

Item 6. The etching solution according to item 4, wherein the secondary amine is at least one member selected from the group consisting of dimethylamine, diethylamine, dipropylamine, and diethanolamine.

Item 7. The etching solution according to item 4, wherein the tertiary amine is at least one member selected from the group consisting of trimethylamine, triethylamine, and tri-ethanolamine.

Item 8. The etching solution according to any one of items 1 to 4, wherein the base having a boiling point higher than that of ammonia is at least one member selected from the group consisting of methylamine, ethylamine, and ethanolamine.

Item 9. The etching solution according to any one of items 1 to 8, further comprising a surfactant.

Item 10. A process of producing an etching solution, the process comprising mixing hydrofluoric acid (a), ammonium fluoride (b), and a salt (c) formed between hydrogen fluoride and a base having a boiling point higher than that of ammonia, such that the concentration of ammonium fluoride (b) is not higher than 8.2 mol/kg, and the total amount of ammonium fluoride (b) and salt (c) formed between hydrogen fluoride and a base having a boiling point higher than that of ammonia is not less than 9.5 mol/kg.

Item 11. An etching process comprising etching an article to be etched using the etching solution as defined in any one of items 1 to 9.

Item 12. A method for producing an etched article, the method comprising etching an article to be etched using the etching solution as defined in any one of items 1 to 9.

Hereinafter, the present invention is described in detail.

An etching solution according to the present invention is an etching solution comprising hydrofluoric acid (a), ammonium fluoride (b), and salt (c) formed between hydrogen fluoride and a base having a boiling point higher than that of ammonia, in which the concentration of ammonium fluoride (b) is not higher than 8.2 mol/kg, and the total amount of ammonium fluoride (b) and salt (c) formed between hydrogen fluoride and a base having a boiling point higher than that of ammonia is not less than 9.5 mol/kg.

Hydrofluoric acid (a) is added so as to obtain a concentration of hydrogen fluoride (HF) at which etching can be suitably performed. For example, hydrofluoric acid (a) is added such that the HF concentration based on the total weight of the etching solution is not higher than 0.5 mol/kg (1 mass %), preferably from 0.0005 mol/kg (0.001 mass %) to 0.25 mol/kg (0.5 mass %), more preferably from 0.0025 mol/kg (0.005 mass %) to 0.2 mol/kg (0.4 mass %), and particularly preferably from 0.0025 mol/kg (0.005 mass %) to 0.175 mol/kg (0.35 mass %).

The etching solution can be suitably used insofar as the concentration of hydrogen fluoride is in the above described ranges; however, the change (increase) in the etch rate after a period of being left to stand becomes greater as the HF concentration in the chemical solution decreases. The present invention can suppress the change in the etch rate by adding a specific salt (described below) even if an etching solution having a low HF concentration as described above is used.

The content of ammonium fluoride ($NH_4F$) (b) is from 0 to 8.2 mol/kg, preferably from 2 to 8.2 mol/kg, and more preferably from 5 to 8.2 mol/kg. Ammonium fluoride has been conventionally used for buffered hydrofluoric acid, and consequently high-purity ammonium fluoride for use in chemical solutions for semiconductor processing is available at low cost. Accordingly, it is preferable to add as much ammonium fluoride as possible within the above described ranges where the change in the etch rate after the period of being left to stand is small.

The salt contained in the etching solution is salt (c) formed between hydrogen fluoride and a base having a boiling point higher than that of ammonia. Examples of bases having a boiling point higher than that of ammonia that form salt (c) include primary amines, secondary amines, tertiary amines, and quaternary ammoniums.

Examples of primary amines include methylamine, ethylamine, propyl amine, butylamine, pentylamine, hydroxylamine, ethanolamine, propanolamine, butanolamine, methoxyethylamine, and methoxypropylamine.

Examples of secondary amines include dimethylamine, diethylamine, dipropylamine, and diethanolamine.

Examples of tertiary amines include trimethylamine, triethylamine, and triethanolamine.

Examples of quaternary ammoniums include tetramethylammonium hydroxide, tetraethylammonium hydroxide, and choline.

The base may be one or a mixture of at least two compounds listed above. A preferable base among the above-mentioned bases is at least one member selected from the group consisting of methylamine, ethylamine, and ethanolamine.

The etching solution comprising salt (c) formed between the base and hydrogen fluoride may be prepared by adding the salt (c) formed between the base and hydrogen fluoride to buffered hydrofluoric acid containing HF and $NH_4F$. Alternatively, the etching solution comprising salt (c) formed between the base and hydrogen fluoride may be prepared by adding equimolar amounts of the base and hydrogen fluoride to buffered hydrofluoric acid containing HF and NH$_4$F and mixing them.

The content of salt (c) in the etching solution based on the total weight of the etching solution is, for example, 1.3 mol/kg or more, preferably from 1.3 to 12 mol/kg, and more preferably from 1.3 to 4.5 mol/kg. By using a concentration in the above ranges, an etching solution in which the change in the etch rate after a standing period is small can be attained.

In the etching solution, the total amount of ammonium fluoride (b) and salt (c) formed between hydrogen fluoride and a base having a boiling point higher than that of ammonia is 9.5 mol/kg or more, preferably from 9.5 to 12 mol/kg, and more preferably from 10 to 11 mol/kg. The minimum total amount of (b) and (c) is set to 9.5 mol/kg because it is necessary to maintain a certain level of processing dimensional accuracy of the films including a thermally-oxidized film and other oxidized films. Specifically, when the total amount of (b) and (c) is lower than 9.5 mol/kg, although the etch rate of the thermally-oxidized film does not increase much over time, the ratio of the etch rate of various oxidized films such as a plasma TEOS film, a BPSG film, an annealed SOD film, etc. relative to the etch rate of the thermally-oxidized film tends to increase. Accordingly, such an etching solution whose total amount of (b) and (c) is lower than 9.5 mol/kg as described above is unsuitable for contact hole cleaning and the like.

A surfactant may further be added to the etching solution. The surfactant improves wettability of hydrophobic surfaces (Si surfaces, poly-Si surfaces, and resist surfaces) and thus prevents a situation where the chemical solution does not diffuse because of the shape of the pattern. The type of surfactant is not particularly limited: it may be cationic, anionic, nonionic, or the like. Examples of cationic surfactants include amines such as $C_8H_{17}NH_2$ and the like. Examples of anionic surfactants include hydrocarbon carboxylic acids such as $C_8H_{17}COOH$ and the like, hydrocarbon sulfonic acids such as $C_8H_{17}SO_3H$ and the like, and fluorinated carboxylic acids such as $H(CF_2)_6COOH$ and the like. Examples of nonionic surfactants include ethers such as polyoxyalkylene alkyl ether.

The amount of surfactant to be added (i.e., concentration) is 2000 mass ppm or less based on the total weight of the etching solution, preferably from 10 to 1500 mass ppm, and more preferably from 50 to 1200 mass ppm.

Usually, the pH of the etching solution ranges from 6.8 to 8.2, preferably from 7 to 8. With a pH in the above ranges, the etch rate of a thermally-oxidized film will be from 10 Å/minute to 100 Å/minute, which is a suitable etch rate.

The etching solution of the present invention is produced by mixing together hydrofluoric acid (a), ammonium fluoride (b), and salt (c) formed between hydrogen fluoride and a base having a boiling point higher than that of ammonia, with the concentration of ammonium fluoride (b) being not higher than 8.2 mol/kg (30 mass %), and the total amount of ammonium fluoride (b) and salt (c) formed between hydrogen fluoride and a base having a boiling point higher than that of ammonia being not less than 9.5 mol/kg.

The etching solution can be prepared by the following method as described above: equimolar amounts of hydrogen fluoride and a base having a boiling point higher than that of ammonia are added to buffered hydrofluoric acid containing hydrofluoric acid (a) and ammonium fluoride (b), or a salt formed between hydrogen fluoride and a base having a boiling point higher than that of ammonia is added to the same, in order to obtain the above described specific concentrations. Considering the generation of heat during mixing, it is preferable that mixing is carried out while cooling. When the pH is outside the above ranges, the pH can be adjusted by adding hydrofluoric acid (for example, 50 mass % hydrofluoric acid) or an aqueous base as needed.

An example of a suitable etching solution of the present invention includes an etching solution for a silicon oxide film; the etching solution comprises the following on the basis of the total weight of the etching solution: 0.0025 mol/kg (0.005 mass %) to 0.175 mol/kg (0.35 mass %) of hydrogen fluoride (a); 5 mol/kg (20 mass %) to 8.2 mol/kg (30 mass %) of ammonium fluoride (b); 1.3 mol/kg to 4.5 mol/kg of salt (c) formed between hydrogen fluoride and an organic amine having a boiling point higher than that of ammonia; and water to fill the remainder.

A method of applying the etching solution of the present invention to a wafer having a silicon oxide film is not particularly limited insofar as the silicon oxide film can be etch-removed. Any method such as coating, immersion, misting, and spraying may be cited as an example. A method in which a wafer is immersed in an etching solution (batch system) and a method in which an etching solution is sprayed to a wafer (single wafer processor) are suitable particularly in view of the advantages of the etching solution of the present invention, i.e., smaller changes in the composition and etch rate over time.

The application temperature of the etching solution of the present invention ranges from about 15 to about 90° C., preferably near room temperature. Application of the etching solution to a wafer at about this temperature enables etching of a silicon oxide film in a suitable manner. The application period of the etching solution is typically about 5 seconds to 30 minutes, although it depends on the thickness of the silicon oxide film and the like.

An article treated with the etching solution of the present invention is rinsed with ultrapure water and dried, and thereby an etched article is attained.

Effects of the Invention

The present invention provides an etching solution in which a change in the composition due to the evaporation of the solution or the like is small, thus reducing the frequency with which the solution must be replaced; and in which the time-dependent change in etch rate is also small, thus allowing uniform etching of a silicon oxide film.

BEST MODE FOR CARRYING OUT THE INVENTION

The present invention is now described referring to examples to clarify the characteristics of the present invention, but the present invention is not limited to these examples.

Preparation of the Etching Solution

Equimolar amounts of HF and a base having a boiling point higher than that of ammonia were added to buffered hydrofluoric acid containing HF and NH$_4$F in order to prepare etching solutions according to the proportions of the composition shown in each table.

Etching solutions in Comparative Examples 1 to 6 were prepared using buffered hydrofluoric acid (HF concentration=0.07 mass %, NH$_4$F concentration=40.3 mass %), hydrofluoric acid (50.0 mass %), and ultrapure water so as to obtain respective initial concentrations.

The etching solution in Example 1 was prepared using buffered hydrofluoric acid (HF concentration=0.07 mass %, $NH_4F$ concentration=40.3 mass %), methylamine (40 mass % aqueous solution), hydrofluoric acid (50.0 mass %), and ultrapure water. Specifically, a total of 400 g of the etching solution was obtained by adding 32 g of hydrofluoric acid (50 mass %) and 8 g of ultrapure water to 298 g of buffered hydrofluoric acid having the above concentrations, and adding 62 g of methylamine (40 mass %) thereto, which was the equimolar amount of the added hydrofluoric acid, while cooling. After preparation, the pH was measured using pH Meter T-21 (glass electrode: 6367-10D) manufactured by HORIBA, Ltd., and the measured value was recorded as the initial pH.

Etching solutions in Example 2 and the like, which contain ethylamine as a base having a boiling point higher than that of ammonia, were prepared using ethylamine (70 mass % aqueous solution) in the same manner as in Example 1. The etching solutions in other Examples, which contain a base having a boiling point higher than that of ammonia, were prepared in the same manner as in Example 1, using a base solution whose concentration was 98 mass % or higher.

Etching solutions in Comparative Examples 7 to 9, 12, and 16 were prepared by adding buffered hydrofluoric acid having the above concentrations until the $NH_4F$ concentration reached 30 mass %, and neutralizing hydrofluoric acid (50.0 mass %) with $NH_3$ water (29 mass %) to fill the remainder.

Note that when the pH of the prepared solution was not within the range of 7 to 8, a small amount of hydrofluoric acid (50.0 mass %) or an aqueous solution of the base was added so as to adjust the pH to within this range.

Measuring the Weight of the Etching Solution

Half of the prepared etching solution was stored in a hermetically-sealed container. The remaining half was placed in a cylindrical container having a diameter of 8 cm, and the weight of the solution in the container was measured (initial weight). Thereafter, the solution was tested by being left in a fume hood for a certain period of time. After being left to stand for a certain period of time, the weight of the solution in the container was measured again (post-standing weight). During the test, the temperature of the fume hood was set to 18 to 22° C. and the humidity thereof was set to 25% to 35%.

Method for Measuring the Etch Rate

The temperature of the etching solution stored in the hermetically-sealed container was set to 25° C. in a temperature-controlled bath. A 1.5 cm×1.2 cm piece of thermally-oxidized film (thin film) having a film thickness of about 1000 Å was immersed in this etching solution. The film thickness of the immersed film was measured after certain periods of time (2.5 minutes, 5 minutes, and 10 minutes). The amount of etching was determined by the difference in the film thickness before and after immersion. The etch rate (initial ER) was determined by the slope obtained by plotting the amount of etching (vertical axis) versus the etching period (horizontal axis).

Similarly, the temperature of the etching solution after being left in the fume hood was adjusted to 25° C. in the temperature-controlled bath. A 1.5 cm×1.2 cm piece of thermally-oxidized film (thin film) having a film thickness of about 1000 Å was immersed in this etching solution. The film thickness of the immersed film was measured after certain periods of time (2.5 minutes, 5 minutes, and 10 minutes). The amount of etching was determined by the difference in the film thickness before and after immersion. The etch rate (post-standing ER) was determined by the slope obtained by plotting the amount of etching (vertical axis) versus the etching period (horizontal axis).

The film thickness was measured using NanoSpec 3000AF-T (manufactured by Nanometrics Japan Ltd.).

Ratio of Increase in Etch Rate (ER)

Further, the ratio of increase in the etch rate (ER) was calculated according to the following expression:

Ratio of increase in ER=[etch rate of thermally-oxidized film after a standing period (post-standing ER)]/[etch rate of initial thermally-oxidized film (initial ER)]

Note that, in Tables 2 to 7, "total F concentration" refers to the sum of "the concentration of ammonium fluoride" and "the concentration of salt formed between hydrogen fluoride and a base having a boiling point higher than that of ammonia".

Comparative Examples 1 and 2

Two chemical solutions were prepared; one with an HF concentration of 0.25 mass % and an $NH_4F$ concentration of 20 mass %; the other with an HF concentration of 0.25 mass % and an $NH_4F$ concentration of 39.4 mass %. These solutions were left in a fume hood for 43 hours. A change in the composition of the chemical solutions and the effect of the change in the composition on the etch rate of thermally-oxidized film were investigated by examining the following: HF concentration and $NH_4F$ concentration before the standing period, initial weight, initial etch rate of the thermally-oxidized film, HF concentration and $NH_4F$ concentration after the standing period, post-standing weight, and post-standing etch rate of a thermally-oxidized film. Table 1 shows the results.

The table shows that when the $NH_4F$ concentration was high, although the amount of evaporation of water was small, the amount of evaporation of ammonia was large, resulting in an increase in the HF concentration and a large increase in the etch rate of thermally-oxidized film.

TABLE 1

| | | | | Initial concentration | | | |
| Example | No. | Salt | Salt concentration mol/kg | HF concentration mass % | $NH_4F$ concentration mass % | Initial pH | Standing time Hr |
| --- | --- | --- | --- | --- | --- | --- | --- |
| Comparative Example | 1 | Not added | 0 | 0.25 | 39.4 | 7.55 | 43 |
| Comparative Example | 2 | Not added | 0 | 0.25 | 20.0 | 6.95 | 43 |

TABLE 1-continued

| Example | No. | Post-standing concentration HF concentration mass % | Post-standing concentration NH$_4$F concentration mass % | Initial weight g | Post-standing weight g | Amount of evaporated water g | Amount of evaporated ammonia g | Initial ER Å/min. | Post-standing ER Å/min. | Ratio of increase in ER |
|---|---|---|---|---|---|---|---|---|---|---|
| Comparative Example | 1 | 0.29 | 39.5 | 299 | 298 | 1.2 | 0.10 | 47 | 59 | 1.26 |
| Comparative Example | 2 | 0.27 | 20.9 | 297 | 283 | 13.2 | 0.02 | 70 | 76 | 1.09 |

Comparative Examples 3 TO 6

Chemical solutions were prepared with the same NH$_4$F concentration (37 mass %) in all the solutions but different HF concentrations varying from 0.05 mass % to 0.25 mass %. Each chemical solution was left to stand, and the ratio of the increase in the etch rate accompanied by a change in the composition was examined. Table 2 shows the results.

The table shows that the lower the HF concentration, the greater the ratio of the increase in the etch rate of thermally-oxidized film.

TABLE 2

| Example | No. | Salt | Salt concentration mol/kg | Initial concentration values HF concentration mass % | Initial concentration values NH$_4$F concentration mass % | Total F concentration mol/kg | Initial pH |
|---|---|---|---|---|---|---|---|
| Comparative Example | 3 | Not added | 0 | 0.05 | 37.0 | 10.0 | 8.00 |
| Comparative Example | 4 | Not added | 0 | 0.15 | 37.0 | 10.0 | 7.65 |
| Comparative Example | 5 | Not added | 0 | 0.20 | 37.0 | 10.0 | 7.55 |
| Comparative Example | 6 | Not added | 0 | 0.25 | 37.0 | 10.0 | 7.50 |

| Example | No. | Standing time Hr | Initial weight g | Post-standing weight g | Initial ER Å/min. | Post-standing ER Å/min. | Ratio of increase in ER |
|---|---|---|---|---|---|---|---|
| Comparative Example | 3 | 70 | 200 | 182 | 7 | 37 | 5.29 |
| Comparative Example | 4 | 70 | 203 | 183 | 24 | 46 | 1.92 |
| Comparative Example | 5 | 70 | 199 | 188 | 34 | 46 | 1.35 |
| Comparative Example | 6 | 70 | 203 | 192 | 44 | 57 | 1.30 |

Examples 1 to 8, and Comparative Examples 7 and 8

Salts formed between hydrogen fluoride and various bases, each having a different boiling point, were added to respective buffered hydrofluoric acid solutions, and the ratio of the increase in the etch rate of thermally-oxidized film accompanied by a change in the composition as a result of each chemical solution being left to stand was examined. Table 3 shows the results.

The table shows that the ratio of the increase in the etch rate due to the evaporation of ammonia was lower in the chemical solutions blended with a salt formed between hydrogen fluoride and a base having a boiling point higher than that of ammonia (−33° C. at 1 atm), compared with the chemical solutions of similar initial etch rates further blended with a salt formed between ammonia and hydrogen fluoride.

TABLE 3

| Example | No. | Base Base name | Base Boiling point ° C. | Concentration of salt of base with HF mol/kg | Concentration of ammonium fluoride mol/kg | Concentration of ammonium fluoride mass % | Total F concentration mol/kg | Initial pH |
|---|---|---|---|---|---|---|---|---|
| Comparative Example | 7 | Ammonia | −33 | 2 | 8.11 | 30.0 | 10.11 | 7.65 |
| Example | 1 | Methylamine | −6 | 2 | 8.11 | 30.0 | 10.11 | 7.55 |
| Example | 2 | Ethylamine | 17 | 2 | 8.11 | 30.0 | 10.11 | 7.55 |
| Example | 3 | Ethanolamine | 171 | 2 | 8.11 | 30.0 | 10.11 | 7.55 |
| Example | 4 | Diethylamine | 55 | 2 | 8.11 | 30.0 | 10.11 | 7.40 |

TABLE 3-continued

| Example | | No. | Base name | Boiling point °C. | Concentration of salt of base with HF mol/kg | Concentration of ammonium fluoride mol/kg | | Total F concentration mol/kg | Initial pH |
|---|---|---|---|---|---|---|---|---|---|
| Example | 5 | | Butylamine | 78 | 2 | 8.11 | 30.0 | 10.11 | 7.45 |
| Comparative Example | 8 | | Ammonia | −33 | 1.5 | 8.11 | 30.0 | 9.61 | 7.70 |
| Example | 6 | | Ethanolamine | 171 | 1.5 | 8.11 | 30.0 | 9.61 | 7.35 |
| Example | 7 | | Diethanolamine | 269 | 1.5 | 8.11 | 30.0 | 9.61 | 7.55 |
| Example | 8 | | Triethanolamine | 335 | 1.5 | 8.11 | 30.0 | 9.61 | 7.45 |

| Example | No. | Standing time Hr | Initial weight g | Post-standing weight g | Initial ER Å/min. | Post-standing ER Å/min. | Ratio of increase in ER |
|---|---|---|---|---|---|---|---|
| Comparative Example | 7 | 70 | 203 | 192 | 22 | 33 | 1.50 |
| Example | 1 | 70 | 200 | 191 | 36 | 37 | 1.03 |
| Example | 2 | 70 | 203 | 195 | 30 | 30 | 1.00 |
| Example | 3 | 70 | 186 | 178 | 28 | 30 | 1.07 |
| Example | 4 | 70 | 190 | 181 | 67 | 60 | 0.90 |
| Example | 5 | 70 | 198 | 191 | 60 | 59 | 0.98 |
| Comparative Example | 8 | 70 | 200 | 182 | 17 | 35 | 2.06 |
| Example | 6 | 70 | 189 | 186 | 66 | 70 | 1.06 |
| Example | 7 | 70 | 191 | 185 | 36 | 40 | 1.11 |
| Example | 8 | 70 | 193 | 187 | 63 | 64 | 1.02 |

Examples 9 to 12, and Comparative Examples 9 to 11

A salt formed between ethylamine and hydrogen fluoride was added to buffered hydrofluoric acid solutions each having varying concentrations of ammonium fluoride, and the ratio of the increase in the etch rate of thermally-oxidized film accompanied by a change in the composition as a result of each chemical solution being left to stand was examined. Table 4 shows the results.

The table shows that the ratio of increase in the etch rate due to the evaporation of ammonia was lower in the chemical solutions in which the concentration of ammonium fluoride was not more than 8.2 mol/kg (30 mass %) compared with the chemical solutions of similar initial etch rates further blended with a salt formed between ammonia and hydrogen fluoride.

Examples 13 and 14, and Comparative Examples 12 to 15

A salt formed between ethylamine and hydrogen fluoride was added to buffered hydrofluoric acid solutions each having varying concentrations of ammonium fluoride. Then, the etch rates of thermally-oxidized film, plasma TEOS film, annealed BPSG film, and annealed SOD film, and the ratios of the etch rate between each film and the thermally-oxidized film were determined. Table 5 shows the results.

The table shows that the ratio of the etch rate between each film and thermally-oxidized film was higher when the total concentration of ammonium fluoride and a salt formed between hydrogen fluoride and ethylamine was lower than 9.5 mol/kg.

Note that, the solutions in Table 6 exhibited a lower ratio of increase in etch rate when the total concentration of ammonium fluoride and a salt formed between hydrogen fluoride and ethylamine was lower than 9.5 mol/kg. However, such solutions cannot be used for contact hole cleaning and the like because of the high ratio of the etch rate between each film and the thermally-oxidized film.

TABLE 4

| Example | No. | Base name | Base Boiling point °C. | Concentration of salt of base with HF mol/kg | Concentration of ammonium fluoride mol/kg | | Total F concentration mol/kg | Initial pH |
|---|---|---|---|---|---|---|---|---|
| | | | | | mol/kg | mass % | | |
| Comparative Example | 9 | Ammonia | −33 | 2 | 8.11 | 30.0 | 10.11 | 7.65 |
| Example | 9 | Ethylamine | 17 | 9.86 | 0.00 | 0.0 | 9.86 | 7.30 |
| Example | 10 | Ethylamine | 17 | 3.35 | 6.76 | 25.0 | 10.11 | 7.60 |
| Example | 11 | Ethylamine | 17 | 2.68 | 7.43 | 27.5 | 10.11 | 7.50 |
| Example | 12 | Ethylamine | 17 | 2 | 8.11 | 30.0 | 10.11 | 7.65 |
| Comparative Example | 10 | Ethylamine | 17 | 1.33 | 8.78 | 32.5 | 10.11 | 7.65 |
| Comparative Example | 11 | Ethylamine | 17 | 1 | 9.46 | 35.0 | 10.46 | 7.70 |

| Example | No. | Standing time Hr | Initial weight g | Post-standing weight after g | Initial ER Å/min. | Post-standing ER Å/min. | Ratio of increase in ER |
|---|---|---|---|---|---|---|---|
| Comparative Example | 9 | 70 | 202 | 188 | 22 | 39 | 1.77 |
| Example | 9 | 70 | 169 | 163 | 45 | 41 | 0.91 |
| Example | 10 | 70 | 200 | 190 | 28 | 28 | 1.00 |
| Example | 11 | 70 | 199 | 188 | 39 | 38 | 0.97 |
| Example | 12 | 70 | 201 | 189 | 24 | 26 | 1.08 |
| Comparative Example | 10 | 70 | 199 | 186 | 25 | 29 | 1.16 |
| Comparative Example | 11 | 70 | 197 | 184 | 20 | 29 | 1.45 |

TABLE 5

| Example | No. | Base name | Base Boiling point °C. | Concentration of salt of base with HF mol/kg | Concentration of ammonium fluoride mol/kg | Concentration of ammonium fluoride mass % | Total F concentration mol/kg | Initial pH |
|---|---|---|---|---|---|---|---|---|
| Comparative Example | 12 | Ammonia | −33 | 2.00 | 8.11 | 30.0 | 10.11 | 7.55 |
| Example | 13 | Ethylamine | 17 | 2.00 | 8.11 | 30.0 | 10.11 | 7.60 |
| Example | 14 | Ethylamine | 17 | 2.00 | 7.50 | 27.8 | 9.50 | 7.65 |
| Comparative Example | 13 | Ethylamine | 17 | 2.00 | 6.00 | 22.3 | 8.00 | 7.35 |
| Comparative Example | 14 | Ethylamine | 17 | 2.00 | 4.50 | 16.7 | 6.50 | 7.20 |
| Comparative Example | 15 | Ethylamine | 17 | 2.00 | 3.00 | 7.4 | 5.00 | 6.90 |

| Example | No. | Thermally oxidized film ER Å/min. | Plasma TEOS film ER Å/min. | Annealed BPSG film ER Å/min. | Annealed SOD film ER Å/min. | Plasma TEOS film ER/thermally oxidized film ER | Annealed BPSG film ER/thermally oxidized film ER | Annealed SOD film ER/thermally oxidized film ER |
|---|---|---|---|---|---|---|---|---|
| Comparative Example | 12 | 32 | 65 | 64 | 64 | 2.03 | 2.00 | 2.00 |
| Example | 13 | 31 | 64 | 62 | 66 | 2.06 | 2.00 | 2.13 |
| Example | 14 | 28 | 62 | 61 | 65 | 2.21 | 2.18 | 2.32 |
| Comparative Example | 13 | 35 | 100 | 80 | 92 | 2.86 | 2.29 | 2.63 |
| Comparative Example | 14 | 38 | 144 | 95 | 136 | 3.79 | 2.50 | 3.58 |
| Comparative Example | 15 | 28 | 131 | 128 | 126 | 4.68 | 4.57 | 4.50 |

TABLE 6

| Example | No. | Base name | Base Boiling point °C. | Concentration of salt of base with HF mol/kg | Concentration of ammonium fluoride mol/kg | Concentration of ammonium fluoride mass % | Total F concentration mol/kg | Initial pH |
|---|---|---|---|---|---|---|---|---|
| Comparative Example | 12 | Ammonia | −33 | 2.00 | 8.11 | 30.0 | 10.11 | 7.55 |
| Example | 13 | Ethylamine | 17 | 2.00 | 8.11 | 30.0 | 10.11 | 7.60 |
| Example | 14 | Ethylamine | 17 | 2.00 | 7.50 | 27.8 | 9.50 | 7.65 |
| Comparative Example | 13 | Ethylamine | 17 | 2.00 | 6.00 | 22.3 | 8.00 | 7.35 |
| Comparative Example | 14 | Ethylamine | 17 | 2.00 | 4.50 | 16.7 | 6.50 | 7.20 |
| Comparative Example | 15 | Ethylamine | 17 | 2.00 | 3.00 | 7.4 | 5.00 | 6.90 |

| Example | No. | Standing time Hr | Initial weight g | Post-standing weight g | Initial ER Å/min. | Post-standing ER Å/min. | Ratio of increase in ER |
|---|---|---|---|---|---|---|---|
| Comparative Example | 12 | 70 | 199 | 190 | 32 | 47 | 1.47 |
| Example | 13 | 70 | 200 | 190 | 31 | 34 | 1.10 |
| Example | 14 | 70 | 201 | 191 | 28 | 31 | 1.11 |
| Comparative Example | 13 | 70 | 200 | 188 | 35 | 37 | 1.06 |
| Comparative Example | 14 | 70 | 201 | 178 | 38 | 41 | 1.08 |
| Comparative Example | 15 | 70 | 200 | 177 | 28 | 31 | 1.11 |

Examples 15 to 17, and Comparative Example 16

Buffered hydrofluoric acid solutions each mixed with 100 ppm or 200 ppm of surfactant were subjected to examination of the ratio of increase in the etch rate of thermally-oxidized film accompanied by a change in the composition as a result of the chemical solutions being left to stand. Table 7 shows the results.

It was found that the ratio of the increase in etch rate due to the evaporation of ammonia was lower in the chemical solutions mixed with a surfactant and a salt formed between ethylamine and hydrogen fluoride, compared with a salt-free chemical solution (Comparative Example 16) of a similar initial etch rate.

Additionally, comparison between the etching solution without a surfactant in Example 13 and the etching solutions in Examples 15 to 17 shows that the presence of the surfactant hardly had any time-dependent effect on the composition of the chemical solutions.

TABLE 7

| Example | No. | Base name | Base Boiling point °C. | Concentration of salt of base with HF mol/kg | Concentration of ammonium fluoride mol/kg | Concentration of ammonium fluoride mass % | Total F concentration mol/kg | Surfactant Molecule | Surfactant Concentration mass ppm |
|---|---|---|---|---|---|---|---|---|---|
| Comparative Example | 16 | Ammonia | −33 | 2 | 8.11 | 30.0 | 10.11 | Not added | 0 |
| Example | 15 | Ethylamine | 17 | 2 | 8.11 | 30.0 | 10.11 | C8H17N(CH3)2 | 200 |
| Example | 16 | Ethylamine | 17 | 2 | 8.11 | 30.0 | 10.11 | C8H17SO3H | 100 |
| Example | 17 | Ethylamine | 17 | 2 | 8.11 | 30.0 | 10.11 | H(CF2CF2)3COOH | 200 |

| Example | No. | Initial pH | Standing time Hr | Initial weight g | Post-standing weight g | Initial ER Å/min. | Post-standing ER Å/min. | Ratio of increase in ER |
|---|---|---|---|---|---|---|---|---|
| Comparative Example | 16 | 7.55 | 70 | 192 | 188 | 31 | 45 | 1.45 |
| Example | 15 | 7.55 | 70 | 183 | 178 | 33 | 34 | 1.03 |
| Example | 16 | 7.55 | 70 | 180 | 175 | 35 | 34 | 0.97 |
| Example | 17 | 7.60 | 70 | 180 | 174 | 30 | 31 | 1.03 |

As shown in the above Examples 1 to 17, insofar as the etching solution is formed so that the total concentration of ammonium fluoride having concentration of 8.2 mol/kg (30 mass %) or less and a salt formed between hydrogen fluoride and a base having a boiling point higher than that of ammonia is not less than 9.5 mol/kg, a change in the etch rate due to the evaporation of ammonia was sufficiently small even after the chemical solution was left to stand, thus providing a consistent etch rate even after a lapse of time. Accordingly, the frequency with which the chemical solution is replaced can be minimized as much as possible, which contributes to the improved efficiency of the etching process.

The invention claimed is:

1. An etching process for a silicon oxide film comprising etching a silicon oxide film to be etched using an etching solution comprising: hydrofluoric acid (a); 0 to 8.2 mol/kg of ammonium fluoride (b); and a salt (c) formed between hydrogen fluoride and a base having a boiling point higher than that of ammonia, wherein the amount of hydrofluoric acid (a) is from 0.0005 mol/kg to not more than 0.5 mol/kg, and the total amount of ammonium fluoride (b), and the salt (c) formed between hydrogen fluoride and a base having a boiling point higher than that of ammonia is not less than 9.5 mol/kg, and
wherein the base having a boiling point higher than that of ammonia is at least one member selected from the group consisting of a primary amine, a secondary amine, a tertiary amine, and a quaternary ammonium compound, and
wherein the primary amine is at least one member selected from the group consisting of methylamine, ethylamine, propylamine, butylamine, pentylamine, hydroxylamine, ethanolamine, propanolamine, butanolamine, methoxyethylamine and methoxypropylamine; and the secondary amine is at least one member selected from the group consisting of dimethylamine, diethylamine, dipropylamine and diethanolamine.

2. The etching process according to claim 1, wherein the base has a boiling point of not less than −30° C.

3. The etching process according to claim 1, wherein the tertiary amine is at least one member selected from the group consisting of trimethylamine, triethylamine, and triethanolamine.

4. The etching process according to claim 1, wherein the base having a boiling point higher than that of ammonia is at least one member selected from the group consisting of methylamine, ethylamine, and ethanolamine.

5. The etching process according to claim 1, wherein the etching solution further comprises a surfactant.

6. A method for producing an etched silicon oxide film, the method comprising etching a silicon oxide film to be etched using the etching process as defined in claim 1.

* * * * *